United States Patent
Koeth et al.

(10) Patent No.: US 11,115,010 B1
(45) Date of Patent: Sep. 7, 2021

(54) ENERGY LOADED DIELECTRICS, SYSTEMS INCLUDING ENERGY LOADED DIELECTRICS, AND METHODS FOR FABRICATION AND USE THEREOF

(71) Applicant: University of Maryland, College Park, College Park, MD (US)

(72) Inventors: Timothy W. Koeth, Brandywine, MD (US); George Hine, College Park, MD (US)

(73) Assignee: UNIVERSITY OF MARYLAND, COLLEGE PARK, College Park, MD (US)

( * ) Notice: Subject to any disclaimer, the term of this patent is extended or adjusted under 35 U.S.C. 154(b) by 306 days.

(21) Appl. No.: 16/413,008

(22) Filed: May 15, 2019

Related U.S. Application Data

(60) Provisional application No. 62/672,013, filed on May 15, 2018.

(51) Int. Cl.
*H03K 3/36* (2006.01)
*H01L 21/762* (2006.01)
*H03K 3/53* (2006.01)
*H03K 3/027* (2006.01)

(52) U.S. Cl.
CPC .......... *H03K 3/36* (2013.01); *H01L 21/762* (2013.01); *H03K 3/027* (2013.01); *H03K 3/53* (2013.01)

(58) Field of Classification Search
None
See application file for complete search history.

(56) References Cited

U.S. PATENT DOCUMENTS

| | | | | |
|---|---|---|---|---|
| 10,032,569 | B2 * | 7/2018 | Rubloff | H01M 6/04 |
| 2008/0122005 | A1 * | 5/2008 | Horsky | H01L 21/2658 257/369 |
| 2008/0305598 | A1 * | 12/2008 | Horsky | H01J 37/3171 438/303 |

(Continued)

OTHER PUBLICATIONS

Stoneridge Engineering, "What are Lichtenberg figures, and how do we make them?," Website [online]. Updated Apr. 2, 2018 (archived Apr. 13, 2018) [retrieved on May 14, 2019]. Retrieved from the Internet: <URL: http://web.archive.org/web/20180413052031/http://www.capturedlightning.com/frames/lichtenbergs.html>.

*Primary Examiner* — Lincoln D Donovan
*Assistant Examiner* — Khareem E Almo
(74) *Attorney, Agent, or Firm* — RowanTree Law Group, PLLC; Frederick F. Rosenberger

(57) ABSTRACT

A dielectric structure is loaded with energy (e.g., charge), which is retained therein until a trigger causes rapid discharge of the loaded energy and generation of an accompanying electromagnetic pulse (EMP). By appropriate design of the dielectric structure and/or trigger, the waveform of the EMP resulting from the rapid discharge can be tailored. Features of the dielectric structure can be modified and/or other devices can be coupled to the dielectric structure to also tailor the EMP, for example, to provide directionality. A modeling unit can predict the discharge in the dielectric structure and/or resulting EMP. The modeling unit can be used to determine charge density spatial distribution within the dielectric structure, shape of the dielectric structure, and/or actuation timing/location necessary to yield a desired waveform for the EMP emanating from the dielectric structure upon discharge.

20 Claims, 6 Drawing Sheets

(56) References Cited

U.S. PATENT DOCUMENTS

| | | | |
|---|---|---|---|
| 2009/0095349 A1* | 4/2009 | Forrest | H01L 31/035281 |
| | | | 136/262 |
| 2011/0073827 A1* | 3/2011 | Rubloff | H01G 11/86 |
| | | | 257/3 |
| 2019/0006545 A1* | 1/2019 | Ayzner | B01J 19/127 |
| 2020/0312407 A1* | 10/2020 | Thirumalai | G11C 13/0069 |

* cited by examiner

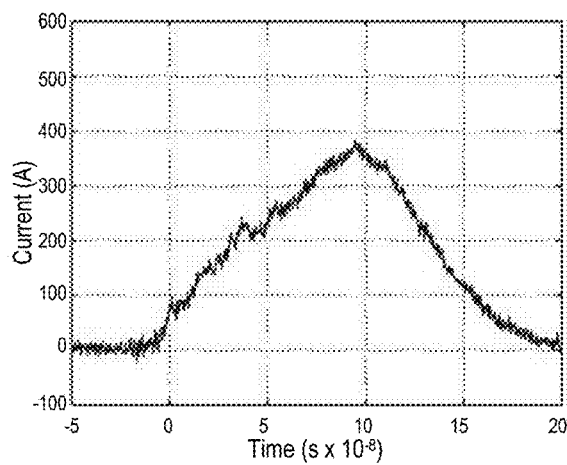
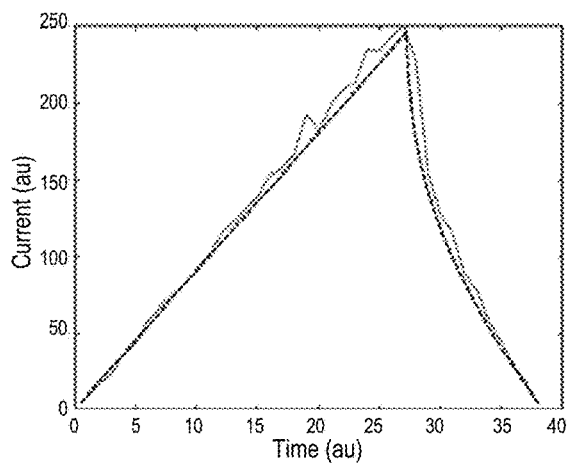
FIG. 8A
FIG. 8B
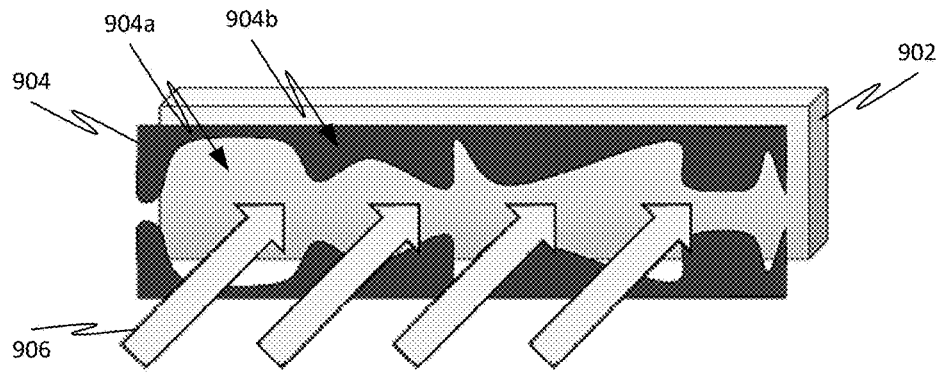
FIG. 9
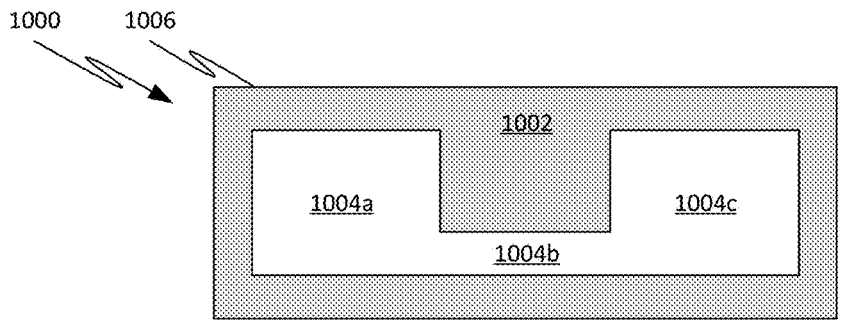
FIG. 10A
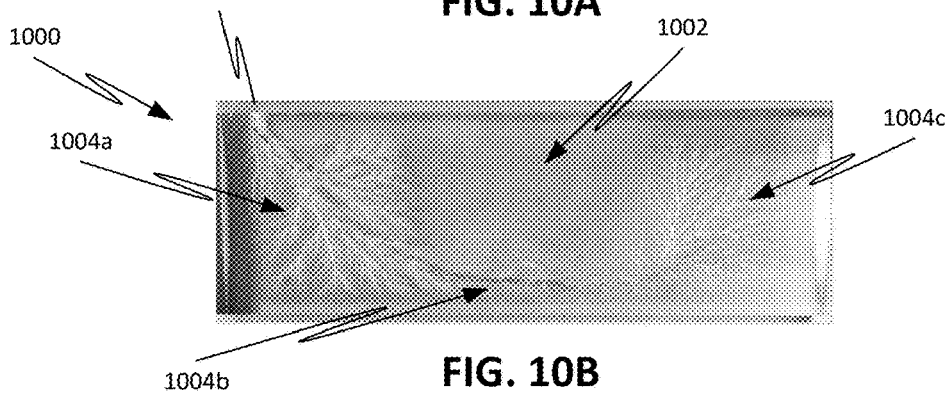
FIG. 10B

ENERGY LOADED DIELECTRICS, SYSTEMS INCLUDING ENERGY LOADED DIELECTRICS, AND METHODS FOR FABRICATION AND USE THEREOF

CROSS-REFERENCE TO RELATED APPLICATIONS

The present application claims the benefit of U.S. Provisional Application No. 62/672,013, filed May 15, 2018, which is hereby incorporated by reference herein in its entirety.

FIELD

The present disclosure relates generally to electromagnetic pulses (EMPs), and more particularly, to designing and discharging of dielectrics loaded with energy (e.g., electrical charge) to produce tailored EMPs.

SUMMARY

Embodiments of the disclosed subject matter provide dielectric structures loaded with energy (e.g., charge via irradiation with electrons, protons, or ions). The dielectric structure can be actuated, e.g., by introduction of a spark or defect at a surface of the dielectric structure, to cause rapid discharge of the energy therein, the discharge resulting in one or more electromagnetic pulses (EMPs). Design of the dielectric structures (e.g., shape, energy loading, composition) and associated components (e.g., post-discharge modification structures) as well as design of the actuation (e.g., type, timing, location) can be used to tailor the waveform of the resulting one or more EMPs. Modeling of the discharge within the dielectric structure can be used to design the dielectric structure, associated components, and/or actuation to yield a desired waveform for the one or more EMPs. Embodiments of the disclosed subject matter thus also include systems for designing, forming, and actuating energy-loaded dielectrics.

In one or more embodiments, a method comprises selecting a waveform for each of one or more EMPs. The method further comprises providing a dielectric structure having a first shape and a loaded charge density spatial distribution therein, and actuating the dielectric structure to discharge charge therein. The providing and actuating can be such that the selected waveform for each of the one or more EMPs is generated.

In one or more embodiments, a system comprises a dielectric structure and an actuator unit. The dielectric structure has a first shape and a loaded charge density spatial distribution therein. The actuator unit can be configured to initiate one or more discharges of the dielectric structure. The dielectric structure and the actuator unit can be configured such that a predetermined waveform for one or more EMPs is generated by the one or more discharges.

In one or more embodiments, a system comprises a modeling unit that determines at least one of charge density spatial distribution, shape, actuation timing, and actuation location for a dielectric structure based on a desired waveform for one or more EMPs emanating from the dielectric structure upon discharge.

Objects and advantages of embodiments of the disclosed subject matter will become apparent from the following description when considered in conjunction with the accompanying drawings.

BRIEF DESCRIPTION OF DRAWINGS

Embodiments will hereinafter be described with reference to the accompanying drawings, which have not necessarily been drawn to scale. Where applicable, some elements may be simplified or otherwise not illustrated in order to assist in the illustration and description of underlying features. Throughout the figures, like reference numerals denote like elements.

FIG. 8A is a graph of current measured from a discharging dielectric structure.

FIG. 8B is a graph of current predicted for the dielectric structure of FIG. 8A using a modeling process similar to that of FIGS. 6A-6B.

FIG. 9 illustrates a perspective view of loading of a dielectric structure using an exemplary mask, according to one or more embodiments of the disclosed subject matter.

FIG. 10A illustrates an example of a patterned-loaded dielectric structure for generating multiple pulses, according to one or more embodiments of the disclosed subject matter.

FIG. 10B is an image of a discharged dielectric structure corresponding to the structure of FIG. 10A.

DETAILED DESCRIPTION

Figure 1:
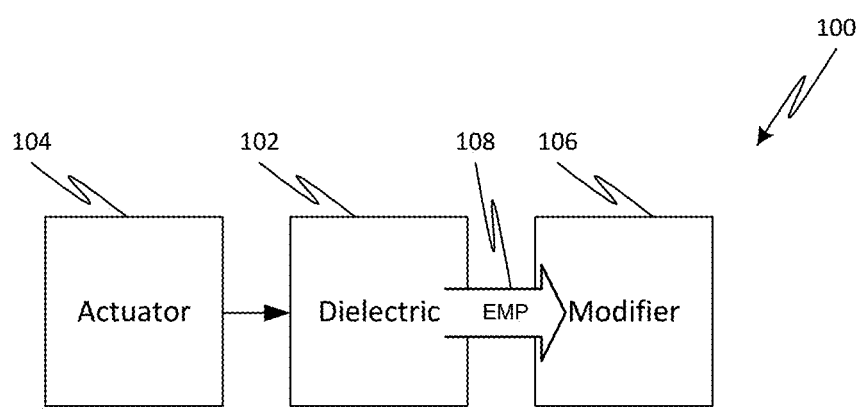
FIG. 1 is a simplified schematic illustrating aspects of a system employing an energy-loaded dielectric structure, according to one or more embodiments of the disclosed subject matter.

In embodiments, a dielectric structure can be loaded with energy, which is retained therein until an external trigger causes rapid discharge of the loaded energy and accompanying generation of one or more electromagnetic pulses (EMI's). For example, the loaded energy can be in the form of electrical charge (e.g., electrons, protons, or ions). By appropriate design of the dielectric structure and the external trigger, the waveform of the EMP resulting from rapid discharge can be tailored. Moreover, features of the dielectric structure can be modified and/or external devices can be coupled to the dielectric structure to further tailor the EMP, for example, to provide directionality.

The dielectric structure (e.g., a block, cylinder, sphere, or any other shape of dielectric, for example, glass or plastic, such as polymethyl methacrylate (PMMA)) can be loaded with charge by irradiation using a particle accelerator (e.g., electrons from an electron accelerator in the 1-10 MeV regime). For example, an electron beam can be used to implant energetic electrons across a face of the dielectric structure. During electron irradiation, one or more layers of electrical charge develop within the interior of the dielectric structure. Such charge loading may be retained by the dielectric structure indefinitely under certain conditions (e.g., cooling of the structure to <194K (dry ice temperatures)). In some embodiments, the electron beam energy can be tuned such that the penetration depth of the impinging electrons is coincident with a mid-plane of the dielectric structure (e.g., approximately equidistant from opposing external surfaces of the dielectric structure). Alternatively or additionally, multiple charge planes can be defined within the dielectric structure by varying the energy of the incident electron beam. Since the resulting electric field from the charge loading fills the bulk of the dielectric, there may be a greater trapped electrostatic energy when the charge is loaded deep into the dielectric (i.e., far from any external surface) than if the charge were loaded just below the external surface.

In any event, the charge density should be sufficiently low such that the dielectric does not self-discharge prior to actuation. Moreover, the charge density should be sufficiently high so that the propagation of the discharge within the dielectric structure sustains itself once actuated. For example, the dielectric structure can be loaded such that the internal electric field is approximately 90% of its self-discharge point.

To initiate electrical discharge (i.e., actuate or trigger) from the loaded dielectric structure, a defect can be produced at a surface of the dielectric structure, such as by firmly tapping the surface with a sharp point (e.g., a nail) or by other mechanical, electrical, or optical actuation schemes, described elsewhere herein. As a result of the surface defect, charge loaded in the dielectric structure is released and rushes out of the dielectric structure in a short period of time, i.e., on the order of a few tens to hundreds of nanoseconds. The discharge can generate a current in excess of hundreds of amperes and can dissipate peak power on the order of gigawatts. Moreover, the discharge produces an EMP, which can affect nearby electronic devices (e.g., within a range of 0 to 6 feet), and thus can be used for device reliability testing or targeted disabling of electronics, among other things.

In embodiments, an EMP system 100 can include a dielectric structure 102 that has been loaded with energy (e.g., charge) therein (also referred to herein as a charge-loaded dielectric or CLD) and an actuator 104 for introducing a surface defect to the dielectric structure 102 for initiating discharge and producing an EMP 108. The actuator 104 may be manual (e.g., by a user), mechanical (e.g., operated by mechanical or electromechanical drive), electrical (e.g., by generating a spark or applying a high voltage), or optical (e.g., laser irradiation), as described elsewhere herein.

The EMP system 100 can optionally include a modification unit 106 configured to interact with the EMP 108 from the dielectric structure 102 and to alter one or more characteristics thereof. For example, the modification unit 106 can alter a frequency, directionality, or other property of the waveform of the EMP 108. Alternatively or additionally, the modification unit 106 may enhance the EMP from the dielectric 102. For example, the modification unit 106 can include a conductor coupled to the dielectric 102 (e.g., a conductor attached to an actuator that introduces the surface defect initiating discharge). The discharge from the dielectric 102 may excite resonance in the conductor, which is a more efficient radiator than the dielectric. Changing the resonant frequency of the conductor (i.e., by changing its size and/or shape) may act to change a center frequency of the emission spectra of the EMP 108 resulting from the discharge. Alternatively or additionally, impedance matching between the dielectric 102 and conductor (e.g., by varying the size/shape of the conductor) may be used to maximize, or at least improve, electric field strength of the EMP 108.

In some embodiments, the modification unit 106 can include lumped and/or distributed components, such as inductors, capacitors, and resistors, to shape the resulting EMP 108 (e.g., time, frequency, and/or amplitude). Alternatively or additionally, the modification unit 106 can include a half-dipole antenna, a dipole antenna, a loop antenna, a helical antenna, a fractal antenna, a waveguide, a radio frequency horn, and/or a curved reflector. In some embodiments, the dielectric can act as a capacitor for the external antenna to produce a tunable dipole radiation.

Although shown separate from each other, it is also possible for the actuator 104 and modifier 106 to be the same structure serving a dual purpose. For example, the actuator 104 can include a wire coupled to the impact point with the dielectric structure 102, such that the wire acts as an antenna for the subsequent discharge.

Alternatively or additionally, it is also possible for the dielectric structure 102, modifier 106, and/or actuator 104 (or portions thereof) to be the same structure serving multiple purposes. For example, a portion of the power (e.g., voltage or current) that is released by the dielectric structure 102 (or a portion thereof) can be used to power or trigger an actuator 104 to initiate subsequent discharge of another dielectric structure (or a separate portion of the original dielectric structure 102).

In some embodiments, the dielectric structure 102 itself may serve as an antenna. For example, when it is desirable to form a directed circularly polarized radiation pattern, either direct helical loading (i.e., charge loaded in a helical pattern) of the dielectric structure itself or a separate helical antenna driven by discharge from the dielectric structure can be used. In the former example, the helical path within the dielectric structure combines the functions of energy storage (and subsequent discharge path) and radiator. In the latter example, the EMP produced by the dielectric structure is used to drive an externally wound helical conductor to form the radiating element.

Figure 7A:
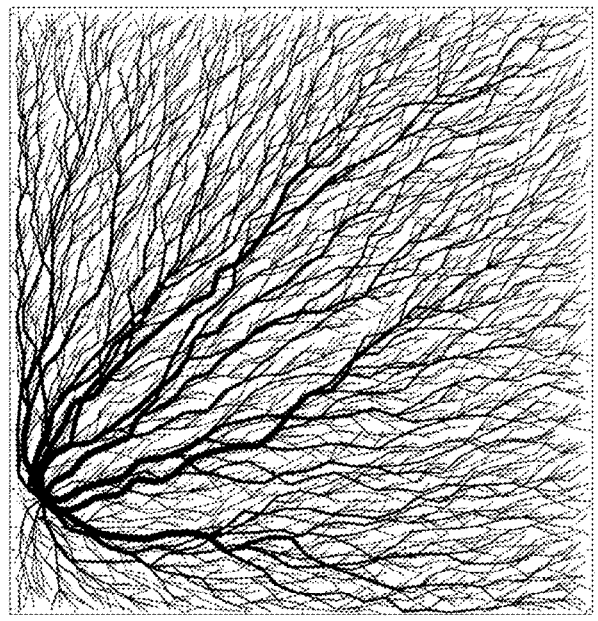
FIG. 7A is an exemplary two-dimensional discharge map generated using a modeling process similar to that of FIGS. 6A-6B.
Figure 7C:
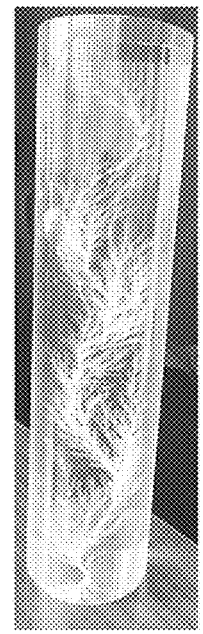
FIG. 7C is an image of a discharged dielectric structure corresponding to the discharge map of FIG. 7B.
Figure 7B:
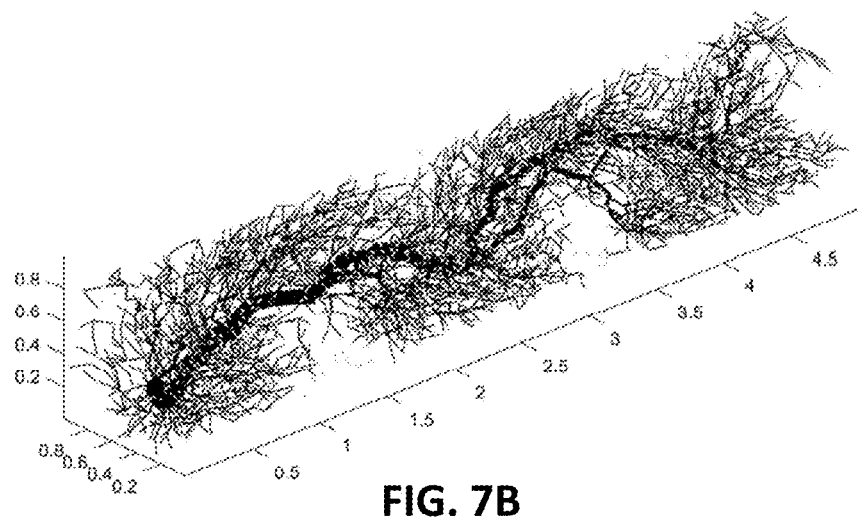
FIG. 7B is an exemplary three-dimensional discharge map generated using a modeling process similar to that of FIGS. 6A-6B.

Location of the actuation point to cause discharge can affect the resulting waveform of the EMP. Additionally or alternatively, pulse shape forming and radiation directivity can be manipulated by masking the dielectric before loading. For example, a directed pulse with circular polarization can be formed by helically loading charge within a dielectric cylinder and subsequently actuating along its end surface (for example, as illustrated in FIGS. 7B-7C). In embodiments, discharge from a CLD can be tailored to produce one or more EMP pulses having certain characteristics, such as, but not limited to, a particular frequency range (e.g., on the order of 100s of MHz to a few GHz), a particular pulse shape (e.g., with features on the order of 10s of nanoseconds to a few microseconds), a burst of pulses (e.g., a pulse train, comprised of at least two peaks separated in time), energy level, and/or directionality (e.g., 20 dB of directional gain). For example, the CLD can drive an external antenna with a short impulse, and the antenna or an antenna circuit can be designed to select a desired frequency range.

The temporal envelope of the pulse can be determined by a number of geometrical and electromagnetic factors throughout the discharge process. These factors can be varied in order to produce an arbitrary waveform. In particular, the speed of propagation of discharge within the dielectric can be influenced by material properties (e.g., hardness, toughness, dielectric constant, etc.), local potential/loaded charge density, and Lichtenberg figure electronic properties (e.g., resistance and reactance as a function of size). Thus, the pulse shape and length can be adjusted by choosing an appropriate loaded charge density spatial distribution.

In addition to the above intrinsic properties, the conduction front can be extrinsically influenced by manipulating its path length. This amounts to placing obstructions in the discharge path in the form of holes, defects, discontinuities (e.g., resistance variations or charge loading variations due to masked areas), or other obstructions within the dielectric structure itself. On discharge, the expanding conduction front circumvents the obstacles by taking a longer propagation path through the dielectric, effectively reducing its propagation speed. Thus, the shape/geometry of dielectric structure can affect characteristics of the discharge waveform.

For example, by creating a choke point (i.e., a region of reduced cross-sectional area as compared to adjacent regions of the dielectric) about the actuation point to impede the neutralizing surface current, the excitation and energy expenditure of low-frequency dielectric-loaded resonant inductor-capacitor (L-C) ringing can be avoided, or at least reduced. As a result, more energy from the discharge can be available for the resulting EMP, thereby increasing its effectiveness.

Figure 2A:
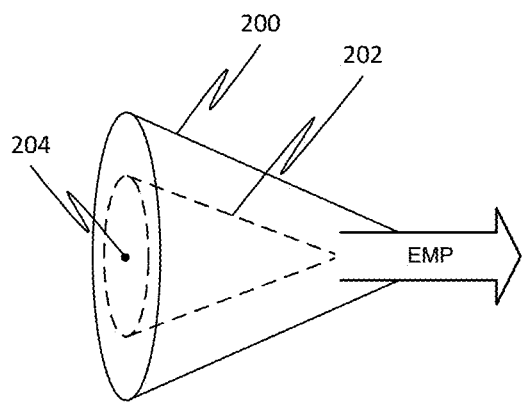
FIG. 2A illustrates an example of an energy-loaded dielectric structure having a conical shape, according to one or more embodiments of the disclosed subject matter.
Figure 2B:
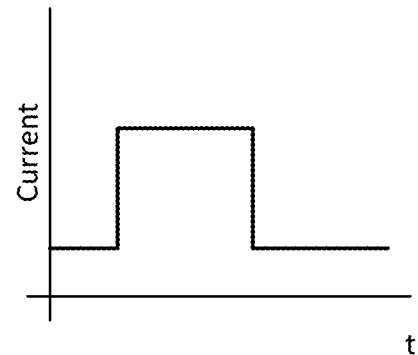
FIG. 2B illustrates an exemplary waveform for an electromagnetic pulse (EMP) resulting from discharge of the energy-loaded dielectric structure of FIG. 2A.

In another example, the shape of the dielectric structure can be tailored to restrict propagation of the discharge and thereby generate a more flattened waveform for the EMP. For example, FIG. 2A shows a conical dielectric structure 200 loaded with charge 202 at a distance below its surface. When actuated at point 204, the resulting discharge from the dielectric 200 can produce a current waveform (and corresponding EMP waveform) similar to that shown in FIG. 2B.

In some embodiments, directionality can be achieved by appropriate coupling to an external device, such as an antenna, a waveguide, or reflector. For example, the EMP emanating from the CLD can be reflected by a curved dish reflector (e.g., with the CLD at the focus). In another example, the CLD can drive a waveguide, which then couples to free space by a horn. In another example, appropriately shaped antennas can be designed with an inherent directionality. In still another example, an array of antennas, properly phased with respect to one another, can produce directional radiation. In short, the matter of directionality may be addressed by peripheral design rather than requiring anything from the design of the CLD itself.

Figure 3:
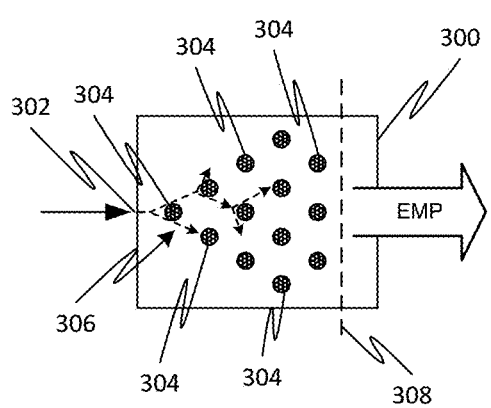
FIG. 3 illustrates an example of an energy-loaded dielectric structure having internal features for EMP waveform shaping, according to one or more embodiments of the disclosed subject matter.

Alternatively or additionally, shape or internal structure of the CLD may be used to provide directionality to the resulting EMP, for example, by impeding discharge within the CLD in one or more directions. For example, FIG. 3 shows a dielectric structure 300 with one or more holes or defects 304 (e.g., enclosed holes or voids) therein. When actuated at 302, the propagation of the resulting discharge 306 is impeded by the presence of defects 304, forcing the discharge to wind its way around the defects. As a result, a flatter propagation front can be produced at 308, which in turn affects the shape of the waveform for the resulting EMP.

Figure 4:
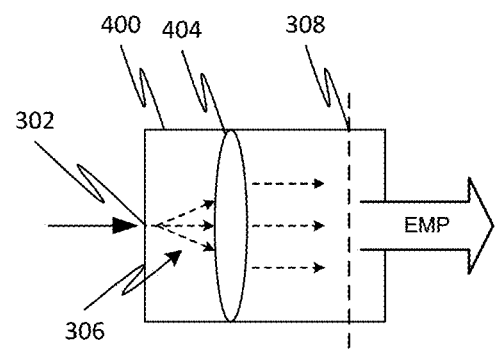
FIG. 4 illustrates another example of an energy-loaded dielectric structure having internal features for EMP waveform shaping, according to one or more embodiments of the disclosed subject matter.

Other techniques can also be employed for shaping the propagation of the discharge front, for example, by using a lens 404, as in the dielectric structure 400 of FIG. 4. The propagating discharge front can be considered to move at a speed that depends on the properties of the underlying dielectric material as well as a configuration of the loaded charge (e.g., in a direction perpendicular to the surface of the discharge front). By structuring the loaded charge, selecting the geometry of the dielectric structure, and/or changing the local material properties (e.g., resistivity), a lensing effect can be generated in the dielectric structure that manipulates the discharge front, for example, to tailor properties (e.g., temporal shape and directionality) of the resulting EMP pulse. For example, in some regions of the dielectric structure 400 the properties can be such that the discharge front is slowed as compared to other regions, thereby manipulating a shape of the discharge front (e.g., flattening the front as illustrated in FIG. 4). This lens 404 need not be external or separate from the dielectric structure 400. Rather, any feature in the charge loading or preparation (i.e., forming or shaping) of the dielectric structure 400 that changes the local discharge front propagation speed can be used as lens 404.

Although the concept of a discharge front has been discussed immediately above and elsewhere herein, it is noted that this serves as a useful approximation for qualitative considerations. However, in reality, the resulting discharge 306 (i.e., a Lichtenberg figure) in the dielectric structure is a fractal with scaling properties going like a power law with non-integer power.

Figure 5:
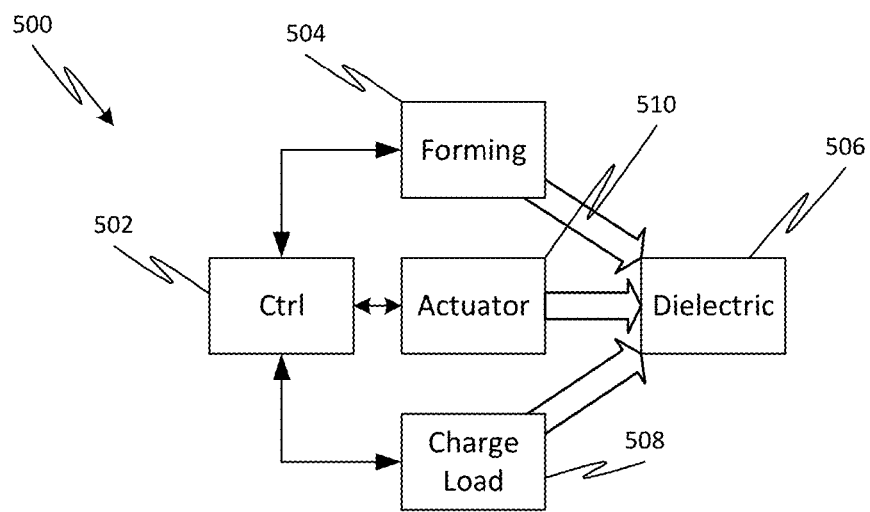
FIG. 5 is a simplified schematic illustrating aspects of a system for designing, forming, and using an energy-loaded dielectric structure, according to one or more embodiments of the disclosed subject matter.

The appropriate spatial distribution to produce a desired pulse can be determined by modeling the discharge within the dielectric structure, for example, using a predictive (deterministic or probabilistic) model. Thus, some embodiments of the disclosed subject matter include an EMP design system 500, for example, as schematically illustrated in FIG. 5. The system 500 can include a controller 502 (i.e., modeling unit) that determines at least one of charge density spatial distribution, shape, and actuation (e.g., defect introduction location) for a dielectric structure 506 based on a desired waveform for an EMP to be generated by the dielectric structure 506.

Based on the model (whether deterministic or probabilistic) and a predetermined desired waveform for the resulting EMP, as well as any other constraints (e.g., a desired geometry for the dielectric, a desired actuation mechanism, etc.), the modeling unit 502 can control one or more separate or integrated units to achieve the final structure producing the desired waveform. For example, the modeling unit 502 can instruct (or send relevant information to) a machining or forming device 504 that produces the shape/geometry of the dielectric structure 506. As noted above, the shape or geometric features (e.g., holes or defects) of the dielectric structure 506 can influence the resulting EMP shape. Thus, the modeling unit 502 may dictate the shape/geometry of the dielectric structure to be formed by the forming device 504.

The modeling unit 502 can instruct (or send relevant information to) a charge loading system 508 (e.g., a particle accelerator) to load the dielectric structure 506 with a determined charge density spatial distribution. The instructing of the charge loading system 508 may also include provision of a mask to shield one or more portions of the dielectric structure 506 during irradiation in order to produce the charge density spatial distribution.

The modeling unit 502 can define characteristics of, or optionally control, an EMP initiation device 510 (i.e., actuator), which introduces a spark or surface defect to the dielectric structure 506 that initiates the discharge. As noted above, the location of the actuation point can influence the resulting EMP shape. Thus, the modeling unit 502 may dictate the actuation point (or plurality of actuation points) in order to achieve a desired waveform.

In some embodiments, one or more predictive models can be used by the modeling unit 502 to determine the temporal pulse shape from a given charge density distribution, or vice versa. Such models can be used to iteratively determine the appropriate charge density distribution necessary to produce an arbitrary pulse.

For example, the modeling unit 502 can employ a deterministic model, where an iterative approach is used to determine propagation of the discharge within the dielectric structure and thereby the resulting EMP waveform. The model can define nodes and edges within a shape of dielectric. The nodes are point-like objects that represent trapped charge, while the edges are connections between adjacent nodes that represent a pathway for the conduction of charge out of the dielectric volume. On a microscopic level, the edge represents the path a charge takes to move from a trapped site to an existing edge. On the macroscopic level, the edge represents a conductive pathway, composed of many microscopic edges, which ultimately serves a volume of charge represented by a macroscopic node.

A distribution of charge can be initiated in the model, for example, by scattering nodes in an N-dimensional space (where N is a whole number) of the dielectric structure. The nodes can be distributed in a regular array, irregular array, or randomly. A point can be selected as the initial defect or a conductor can be added to the exterior of the dielectric structure in the model. The electric field at various points within the dielectric structure can then be calculated and those points above a predetermined threshold can be converted to a conductor. The process can iterate until the discharge propagation within the dielectric structure is completed.

Figure 6A:
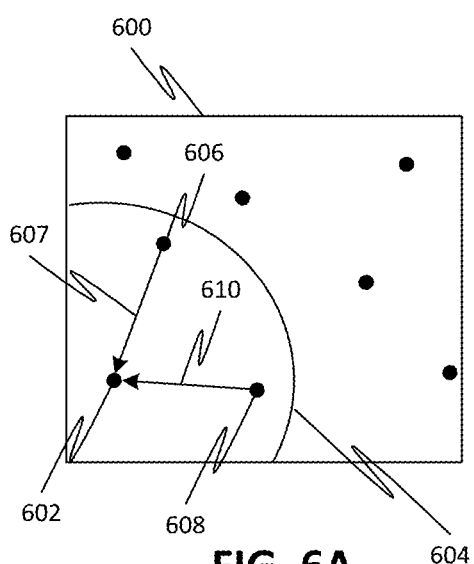
FIGS. 6A-6B illustrate sequential iteration steps in an exemplary modeling of discharge of energy in a dielectric structure upon actuation, according to one or more embodiments of the disclosed subject matter.
Figure 6B:
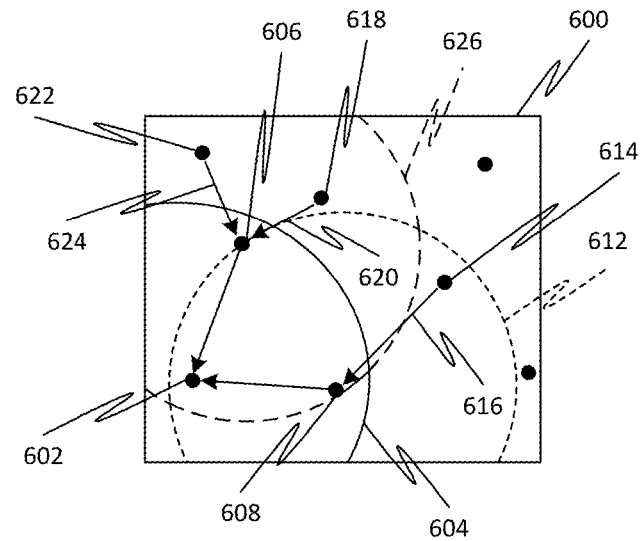

Alternatively, points within a predetermined radius from a node discharged in a prior iteration can be converted to a conductor. For example, sequential discharges can occur iteratively by stepping through each node that discharged on the previous iteration and connecting it by an edge to all nodes within a given radius or above an electric field threshold. For example, FIG. 6A illustrates an initial step in such a model for a dielectric 600. Node 602 has been selected as the initial defect and all other nodes (e.g., 606, 608) within radius 604 are connected to that initial defect 602 by respective edges 607, 610. In the subsequent iteration illustrated in FIG. 6B, nodes 606, 608 are considered discharged. A second radius 626 is defined for node 606, and nodes 618, 622 within radius 626 are connected to node 606 by respective edges 620, 624. Similarly, a third radius 612 is defined for node 608, and node 614 within radius 612 is connected to node 608 by edge 616. These iterations repeat until all nodes within the dielectric model 600 are discharged or otherwise connected to other nodes by respective edges.

This model can produce figures qualitatively similar to experimentally produced Lichtenberg figures. For example, FIGS. 7A-7B illustrate examples of discharge maps produced by the model for a two-dimensional dielectric structure and three-dimensional dielectric structure, respectively. Note that the maps of FIGS. 7A-7B further adjusted the thickness of edges based on the number of nodes serviced by a particular edge branch to more closely approximate actual Lichtenberg figures. FIG. 7C shows the pattern (Lichtenberg figure) achieved by discharging an actual dielectric structure corresponding to the model of FIG. 7B.

Moreover, the model can be used to predict the form of a pulse of current expressed through the discharge process. For example, the number of edges in each time step can be counted as an approximation to the current generated. Alternatively or additionally, the discharge current can be approximated by considering expansion on an (N−1)-dimensional shell in the N-dimensional space, which approximation predicts current pulses in the above limit of fast neutralization and discharge rules that are independent of local node density. FIG. 8B is a graph of the current estimated using such a discharge model, where the solid line represents the number of units of charge accessed in a single time step and the dashed line represents an analytical solution. FIG. 8A is a graph of the actual current measured from a comparable dielectric, which current waveform has a similar shape to that predicted by the model in FIG. 8B.

The model noted with respect to FIGS. 6A-8B represents discharge of a dielectric with a strong approximation that charge quickly flows out with vanishing resistance and reactance. However, there is also a response due to the impedance of the load, which can be considered in the model by accounting for electric potential that produce a voltage on the conductive network in the dielectric. For example, potential can be added to the model as a function independent of time and as a feature that alters the rules of sequential discharge. This alteration can manifest as a local change in the radius (e.g., 604, 612, 616 in FIGS. 6A-6B) within which discharge occurs, or as a change in the likelihood of discharge to a particular point.

In another example, potential can be added to the model by numerically calculating potentials on each time step, for example, by introducing a grid within which are the nodes and on which potentials and electric fields can be calculated. Employing a methodology similar to the particle-in-cell (PIC) method, the potential can be solved on the grid by first weighing charge onto the grid, solving on the grid, and then interpolating potential back onto positions of the particles (i.e., nodes). Such a modification to the model can help to indicate predicted impedance of the dielectric, which can be used to find effective coupling of the dielectric to a load (e.g., antenna).

In still another example of the deterministic model, the pathway of discharge can be represented by a random scattering of points for a microscopic view of the discharge.

For the macroscopic view, points can be generated stochastically from terminal edges, in which case a random distribution of nodes emerges during the model of the discharge that is not otherwise a part of the initial conditions.

In addition to, or in place of, the deterministic model described above, a probabilistic model can be employed. In embodiments of the modeling unit 502 employing a probabilistic model, a stochastic function of the electric field or potential can be used. For example, the probabilistic model can involve dynamical redistribution of conductor charge, with or without calculation of the full electromagnetic field. Indeed, the direct calculation of electric potentials can require substantial memory and processing power, as the calculations required scale with the square of the number of points to be calculated. Thus, while the potential on a set of nodes (e.g., of size N) can be described by a 1-D array (as can the charge on the set of nodes), the mapping of the charge to potential involves a 2-D matrix (e.g., of size $N^2$). Moreover, the matrix multiplication operation used in calculating potentials can scale as a cube of the number of points (e.g., $N^3$), as can the inversion of the matrix used to calculate an equipotential on the conductor.

Apart from calculating potentials, the dynamics of the discharge within the dielectric can be prescribed by local rules. For example, in determining which regions of the dielectric should be converted to conductive in the discharge modeling, only the nearest mesh points to an existing conductive region are candidates to be added. Moreover, charge can only flow between connected nodes and does so resistively (i.e., proportionally).

In embodiments of the probabilistic model, processing time can be improved (and/or processing resources decreased) by calculating the potential on a regular grid, which may be separate from the nodes or mesh points. For example, local charge can be weighted on the regular grid, and the potential calculated on the grid using a fast Fourier transform (FFT). Since the FFT scales like N log N, rather than $N^2$, the processing load can be reduced as compared to the deterministic model. The resulting potential can then be interpolated from the regular grid back to the mesh points, and iterated until the full propagation (or desired part of the propagation) of the discharge is determined.

The probabilistic model, which can employ aspects of a particle-in-cell (PIC) method, can also allow electromagnetic qualities to be introduced. In such a configuration, currents as well as charges can be interpolated onto the regular grid. Alternatively or additionally, a full electromagnetic vector potential can be calculated, for example, to provide insight into or model the effect of electrical or magnetic reactance.

Based on the modeling, loading of charge into the dielectric structure can be chosen to provide a desired output. For example, the dielectric can be loaded with a charge density spatial distribution (i.e., programmed by writing a charge pattern) that is designed based on the anticipated discharge characteristics suggested by the model to produce a desired EMP output. Writing of such a pattern can be achieved in multiple ways. For example, a mask could be used to block out regions of the dielectric that will not have charge.

FIG. 9 illustrates such an example, where mask 904 is interposed between incident radiation 906 and a dielectric structure 902. The mask 904 has areas 904a through which the radiation 906 can freely pass to impact (and thereby load with charge) the dielectric 902. Conversely, areas 904b prevent (or at least reduce) exposure of the underlying dielectric 902 to the incident radiation 906. For example, areas 904b of mask 904 may be formed of lead.

Alternatively or additionally, the patterned loading of charge into the dielectric structure can be achieved by scanning a beam spot from the loading source (e.g., irradiation beam) with respect to the dielectric. For example, a small particle beam can be moved with respect to the dielectric or vice versa. In another example, an aperture through which the particle beam passes could be moved with respect to the dielectric or vice versa. In any of these examples, the intensity of the incident beam may remain constant or be modulated as the beam moves between different areas of the dielectric.

Alternatively or additionally, the dielectric itself can be shaped such that the loaded charge takes a desired pattern once the charge comes to rest within the dielectric. For example, the dielectric may be machined, molded, or otherwise formed to have a one-dimensional, two-dimensional, or three-dimensional pattern, such as that of the area 904a of mask 904. In such an example, charge loading may be accomplished by uniform irradiation 906 of the shaped dielectric structure without use of mask 904.

Although the discussion above has focused on providing a pulse with particular characteristics, it is also possible that multiple EMPs (i.e., pulse train) can be produced, either from a single dielectric structure or multiple dielectric structures. The modeling noted above can also be used to predict discharge from the dielectric structure(s) that generate such multiple EMPs, which modeling can be used to tailor characteristics of such EMPs.

For example, when using a single dielectric structure, masking can be used to create regions of different charge loading, which in turn generate respective pulses upon discharge. For example, FIGS. 10A-10B illustrate a dielectric block 1000 with masked regions 1002 and unmasked regions 1004a-1004c. Upon actuation, for example at point 1006, the unmasked regions discharge in sequence. In particular, the discharge for unmasked region 1004a produces a first pulse at a first time. As the discharge propagates through region 1004a, it is restricted by the limited width of bridge 1004b. Once the discharge reaches unmasked region 1004c, a second pulse is produced, which is spaced from the first pulse by a particular time delay based on the characteristics of the bridge 1004b and other properties of the dielectric structure 1000.

In another example, a simple configuration can include a one-dimensional array of separate dielectric structures, each with its own actuation mechanism (e.g., a discharge electrode). The relative delay between actuations of the dielectric structures yields many discharge events spaced apart in time that together can form an arbitrary pulse shape or train of pulses. The current pulse or EMP from each of the dielectric structures can be determined via modeling or experimentally, and the determined EMPs can be used as the kernel for constructing an arbitrary pulse by summing, for example:

$$\text{total waveform} = \sum_{n=1}^{N} K_n(t - l_n - \tau_n) \qquad (1)$$

where $K_n$ is the waveform as a function of time of pulse unit/discharge unit for the $n^{th}$ dielectric structure (and can take into account the amount and/or spatial profile of charge loaded, the size and/or shape of the respective dielectric structure, the material(s) of the dielectric structure, and any augmentations or pulse modifications (e.g., antenna) particular to that dielectric structure), N is the total number of units forming the array, in is the inherent latency of the $n^{th}$ dielectric structure, and tin represents the delay associated with actuation of the $n^{th}$ dielectric structure.

Although the discussion above addresses multiple structures, the same technique can apply to a single dielectric structure subject to multiple actuations, where the above n dielectric structures instead represent a subunit of the single dielectric structure. Thus, multiple actuations of a single dielectric structure can be used to generate an arbitrary pulse shape or a train of arbitrary pulses.

As noted above, actuation of the discharge from the loaded dielectric can be accomplished via mechanical (e.g., explosive, solenoid, or piezoelectric based), electrical, and/or optical techniques. For example, an explosive material could be used to mechanically damage a surface of each dielectric structure to initiate the respective discharge at different times. This could be accomplished by using explosive materials with different propagation speeds that thereby reach the respective dielectric structure at the appropriate time for actuation. In another example, discharge in each dielectric structure is initiated by action of a solenoid-drive armature or a piezoelectric actuator, with the relative delay between actuations being controlled electronically.

In still another example, the discharge of each dielectric structure is initiated by an electrical impulse that in turn produces a spark or mechanical defect at a surface of the respective dielectric structure, with the relative delay between actuations being controlled electronically. In still another example, the discharge of each dielectric structure is initiated by a high-power laser that creates a mechanical surface defect or otherwise seeds an ionization avalanche, with the relative delay between actuations being controlled electronically or via optical path length differences.

Figure 11:
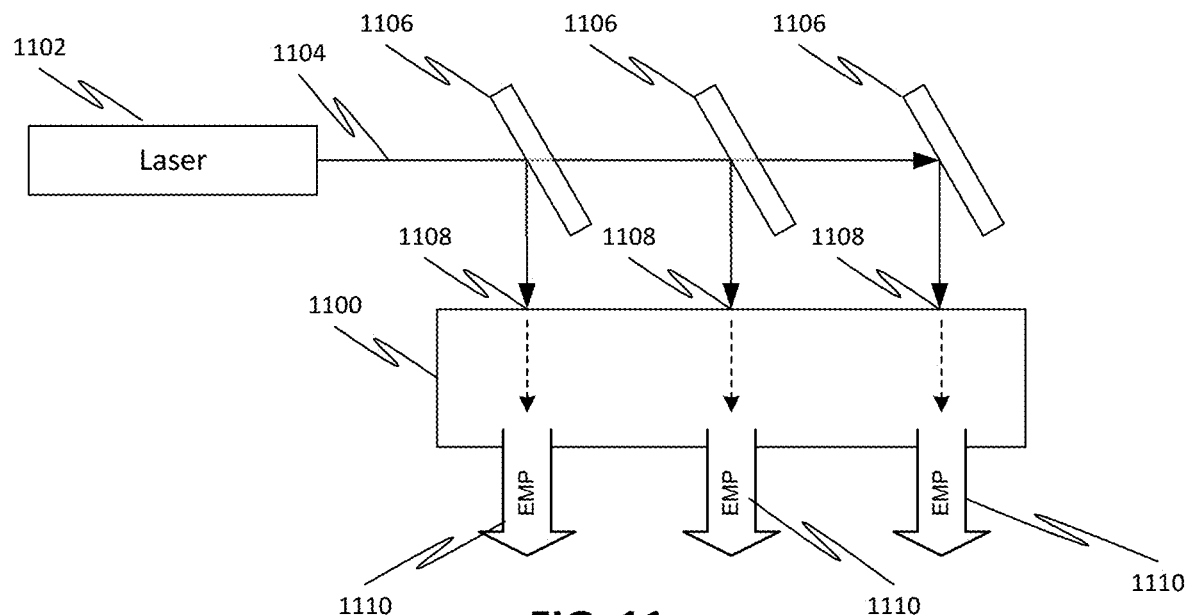
FIG. 11 is a simplified schematic illustrating aspects of an exemplary multi-site actuation of a dielectric structure, according to one or more embodiments of the disclosed subject matter.
Figure 12:
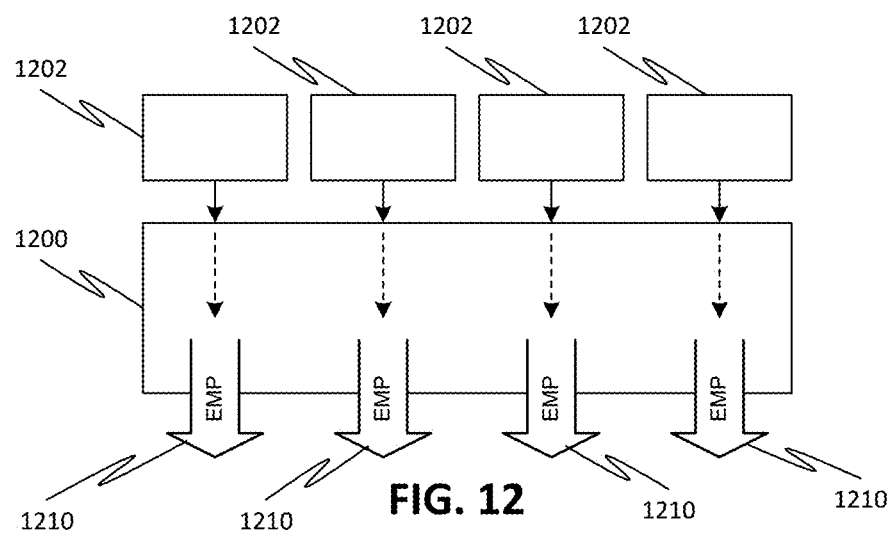
FIG. 12 is a simplified schematic illustrating aspects of another exemplary multi-site actuation of a dielectric structure, according to one or more embodiments of the disclosed subject matter.

For example, FIG. 11 shows a setup where multiple beam splitters 1106 are used to direct an input beam 1104 from a laser 1102 to different surface regions 1108 of dielectric structure 1100 to initiate discharge and thereby produce respective EMPs 1110. Similarly, FIG. 12 shows a setup where multiple actuation devices 1202 (which may be separate actuation devices or simply different actuation portions of a single device) are used to initiate discharge at different regions in dielectric structure 1200 and thereby produce respective EMPs 1210.

Figure 13:
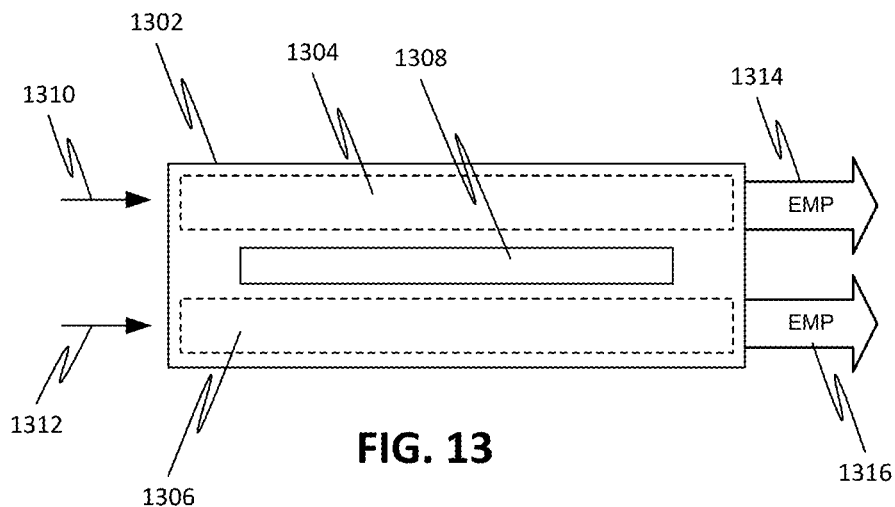
FIG. 13 is a simplified schematic illustrating aspects of multi-site actuation of an exemplary dielectric structure having internal features separating discharge regions, according to one or more embodiments of the disclosed subject matter.

Other configurations for the dielectric structure are also possible. For example, a first region 1304 of a dielectric structure 1302 can be separated from a second region 1306 by a trench, hole, or defect 1308, as illustrated in FIG. 13. Alternatively, the separating region 1308 may simply be a connecting portion of the dielectric 1302 that has a different material property (e.g., higher resistivity) than that of regions 1304, 1306. The first region 1304 may have a charge loading less than that of the second region 1306. As a result, the discharge front propagating through the first region 1304 upon actuation at 1310 will be slower than the discharge front propagating through the second region 1306 upon actuation at 1312. The different propagation speeds, together with the timing of actuations 1310, 1312, can be used to control a timing between respective EMP pulses 1314, 1316 (e.g., to produce a chain of multiple pulses), or to tailor a waveform formed by the combination of EMP pulses 1314, 1316 (i.e., when EMP pulses 1314 and 1316 overlap in time).

Figure 14:
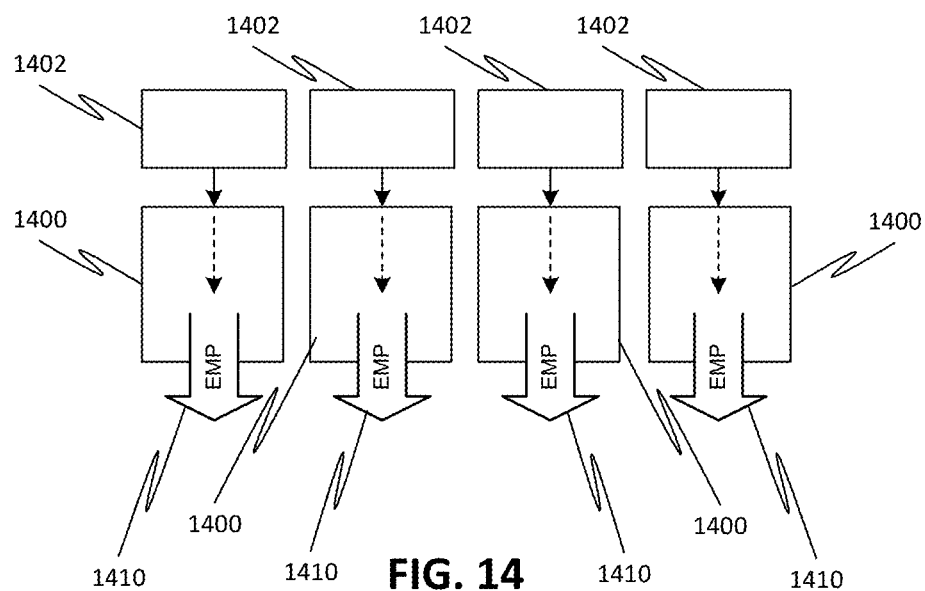
FIG. 14 is a simplified schematic illustrating aspects of multiple actuations of separate dielectric structures, according to one or more embodiments of the disclosed subject matter.

It is also possible to build an array of CLDs discharged in a sequence to produce a desired pulse shape and pulse train. Desired pulses or pulse trains can be constructed using individual CLDs as a building block, for example, as shown in FIG. 14. The building blocks 1400 can be standardized and well characterized prior to assembly into the array, each with individual actuators 1402 (which may be separate actuation devices or simply different actuation portions of a single device) that can be triggered simultaneously or sequentially to produce respective EMPs 1410.

The scales of temporal control follow from the method of discharge initiation. Depending on the desired time scales, different methods of relative timing may be appropriate, including, but not limited to, mechanical discharge (e.g., explosives, machinery), electromechanical discharge (e.g., solenoid or piezoelectric actuators), electrical discharge (e.g., high-voltage pulses or sparking), and optical discharge (e.g., discharge by laser machining—ultra-short pulses at high repetition rates, discharge by melting—high average power laser irradiation, discharge by mechanical defect—high energy pulsed lasers).

In some embodiments, the discharge (or a portion of the power resulting from the discharge) from the dielectric structure can be used to initiate subsequent discharge of the same or different dielectric structure. For example, the current from the discharge of the dielectric structure can be passed through a transformer, which in turns drives an electrode to create a spark. This spark can be used to initiate discharge of another dielectric structure. In some embodiments, the coupling between discharge and initiation of subsequent discharge may be repeated for multiple dielectric structures, thereby resulting in a pulse train from the sequential discharges. It is noted that the coupling of discharge to production of a spark is only exemplary, and other initiation mechanisms, such as those mentioned above and elsewhere herein, are also possible according to one or more contemplated embodiments.

In some embodiments, the actuation of multiple blocks by internal or external mechanism can also be used to shape a composite pulse. For example, if multiple pulses from a single unit overlap in time (i.e., triggered by a delay shorter than a duration of the pulses), the individual pulses add together to form a composite pulse. The timing of the actuation can thus define the shape of the composite pulse.

In some embodiments, any of the techniques described herein for producing one or more tailored EMPs from one or more charge loaded dielectric structures can be combined, for example, to separate time scales. Thus, the model (whether deterministic or probabilistic) can be used to design individual pulses from single CLDs, and the multi-block method can be used to assemble single CLDs with designed individual pulses to construct arbitrary trains of many pulses (which may obviate the need for a single CLD with an otherwise large and unwieldy path length to generate such a pulse train).

The one or more EMPs discharged from the dielectric structure 102 of EMP system 100, or dielectric 506 of system 500, can be used for a variety of applications, such as, but not limited to electronic device reliability testing, where the performance or ruggedness of the electronic device is characterized during and/or after being subjected to the one or more EMPs. In another example, the EMP system 100 or 500 can be used to disrupt electronic devices. In particular, the EMP can be used to disable or impede performance of an electronic device within a given spatial range of the system 100 or 500. As noted above, the discharge from CLDs produces an EMP that can negatively impact electronic devices.

In another example, the EMP system 100 or 500 can be used for power storage. In particular, the discharge from the dielectric structure 102 or 506 can used to temporarily power transmission of a signal via an antenna. In still another example, the EMP system 100 or 500 can be used for information encoding. In particular, the dielectric structure 102 or 506 can be loaded to produce a particular EMP pulse train that conveys information. For example, the CLD could loaded with a particular pulse sequence that yields an "S.O.S." or another signal. The discharge of the CLD could also power a transmitter to send the signal.

Applications of the disclosed energy-loaded dielectrics and associated systems, as well as the disclosed techniques for designing and discharging such energy-loaded dielectrics, other than those specifically enumerated above will be readily apparent to one of ordinary skill in the art and are within the scope of the disclosed subject matter.

It will be appreciated that some aspects of the disclosed subject matter can be implemented, fully or partially, in hardware, hardware programmed by software, software instruction stored on a computer readable medium (e.g., a non-transitory computer readable medium), or any combination of the above. For example, components of the disclosed subject matter, including components such as a controller, process, modeling unit, or any other feature, can include, but are not limited to, a personal computer or workstation or other such computing system that includes a processor, microprocessor, microcontroller device, or is comprised of control logic including integrated circuits such as, for example, an application specific integrated circuit (ASIC).

Features discussed herein can be performed on a single or distributed processor (single and/or multi-core), by components distributed across multiple computers or systems, or by components co-located in a single processor or system. For example, aspects of the disclosed subject matter can be implemented via a programmed general purpose computer, an integrated circuit device, (e.g., ASIC), a digital signal processor (DSP), an electronic device programmed with microcode (e.g., a microprocessor or microcontroller), a hard-wired electronic or logic circuit, a programmable logic circuit (e.g., programmable logic device (PLD), programmable logic array (PLA), field-programmable gate array (FPGA), programmable array logic (PAL)), software stored on a computer-readable medium or signal, an optical computing device, a networked system of electronic and/or optical devices, a special purpose computing device, a semiconductor chip, a software module or object stored on a computer-readable medium or signal.

When implemented in software, functions may be stored on or transmitted over as one or more instructions or code on a computer-readable medium. The steps of a method or algorithm disclosed herein may be embodied in a processor-executable software module, which may reside on a computer-readable medium. Instructions can be compiled from source code instructions provided in accordance with a programming language. The sequence of programmed instructions and data associated therewith can be stored in a computer-readable medium (e.g., a non-transitory computer readable medium), such as a computer memory or storage device, which can be any suitable memory apparatus, such as, but not limited to read-only memory (ROM), programmable read-only memory (PROM), electrically erasable programmable read-only memory (EEPROM), random-access memory (RAM), flash memory, disk drive, etc.

As used herein, computer-readable media includes both computer storage media and communication media, including any medium that facilitates transfer of a computer program from one place to another. Thus, a storage media may be any available media that may be accessed by a computer. By way of example, and not limitation, such computer-readable media may comprise RAM, ROM, EEPROM, CD-ROM or other optical disk storage, magnetic disk storage or other magnetic storage devices, or any other medium that may be used to carry or store desired program code in the form of instructions or data structures and that may be accessed by a computer.

Also, any connection is properly termed a computer-readable medium. For example, if the software is transmitted from a website, server, or other remote source using a transmission medium (e.g., coaxial cable, fiber optic cable, twisted pair, digital subscriber line (DSL), or wireless technologies such as infrared, radio, and microwave), then the transmission medium is included in the definition of computer-readable medium. Moreover, the operations of a method or algorithm may reside as one of (or any combination of) or a set of codes and/or instructions on a machine readable medium and/or computer-readable medium, which may be incorporated into a computer program product.

One of ordinary skill in the art will readily appreciate that the above description is not exhaustive, and that aspects of the disclosed subject matter may be implemented other than as specifically disclosed above. Indeed, embodiments of the disclosed subject matter can be implemented in hardware and/or software using any known or later developed systems, structures, devices, and/or software by those of ordinary skill in the applicable art from the functional description provided herein.

In this application, unless specifically stated otherwise, the use of the singular includes the plural, and the separate use of "or" and "and" includes the other, i.e., "and/or." Furthermore, use of the terms "including" or "having," as well as other forms such as "includes," "included," "has," or "had," are intended to have the same effect as "comprising" and thus should not be understood as limiting.

Any range described herein will be understood to include the endpoints and all values between the endpoints. Whenever "substantially," "approximately," "essentially," "near," or similar language is used in combination with a specific value, variations up to and including 10% of that value are intended, unless explicitly stated otherwise.

The foregoing descriptions apply, in some cases, to examples generated in a laboratory, but these examples can be extended to production techniques. Thus, where quantities and techniques apply to the laboratory examples, they should not be understood as limiting.

The terms "system," "device," "unit," and "structure" have been used interchangeably herein, and the use of one term in the description of an embodiment does not preclude the application of the other terms to that embodiment or any other embodiment.

It is thus apparent that there is provided, in accordance with the present disclosure, energy loaded dielectrics, systems including energy loaded dielectrics, and methods for fabrication and use thereof. Many alternatives, modifications, and variations are enabled by the present disclosure. While specific examples have been shown and described in detail to illustrate the application of the principles of the present invention, it will be understood that the invention may be embodied otherwise without departing from such principles. For example, disclosed features may be combined, rearranged, omitted, etc. to produce additional embodiments, while certain disclosed features may sometimes be used to advantage without a corresponding use of other features. Accordingly, Applicant intends to embrace all such alternative, modifications, equivalents, and variations that are within the spirit and scope of the present invention.

The invention claimed is:

1. A method comprising:
   (a) selecting a waveform for each of one or more desired electromagnetic pulses (EMPs);
   (b) providing a dielectric structure having a first shape and a loaded charge density spatial distribution therein, the dielectric structure being loaded with charge by irradiation with electrons, protons, or ions; and
   (c) actuating the dielectric structure to discharge charge therein,
   wherein (b) and (c) are such that the selected waveform for each of the desired one or more EMPs is generated, and
   the actuating comprises introducing a spark or defect at a surface of the dielectric structure.

2. The method of claim 1, wherein at least one of a location of the introduced spark or defect, the first shape of the dielectric structure, and loading of charge in the dielectric structure is based at least in part on the selected waveform.

3. The method of claim 1, wherein (c) actuating the dielectric structure includes modifying the discharge from the dielectric structure to produce the desired one or more EMPs.

4. The method of claim 1, further comprising (d) modeling discharge from a model dielectric, wherein at least one of the first shape for the dielectric structure, the loaded charge density spatial distribution, and the actuating of (c) is based at least in part on the modeling of (d).

5. The method of claim 1, wherein the actuating includes providing multiple sub-actuations to the dielectric structure, the sub-actuations being spaced in time or location from each other to produce multiple pulses that form the one or more EMPs.

6. The method of claim 5, wherein:
   the dielectric structure includes multiple separate dielectric units, each dielectric unit having charged loaded therein, the multiple dielectric units together providing the loaded charge density spatial distribution, and
   each separate dielectric unit generates from the corresponding sub-actuation a respective pulse of the multiple pulses.

7. The method of claim 5, wherein the dielectric structure includes a single dielectric unit providing the loaded charge density spatial distribution.

8. The method of claim 1, wherein:
   the actuating includes providing a single actuation to the dielectric structure that results in multiple pulses spaced in time from each other, the multiple pulses forming the one or more EMPs, and
   the dielectric structure includes a single dielectric unit providing the loaded charge density spatial distribution.

9. The method of claim 1, further comprising, prior to (c), storing the loaded dielectric structure at a temperature below 0° C.

10. A system comprising:
   a dielectric structure having a first shape and a loaded charge density spatial distribution therein, the dielectric structure being loaded with charge by irradiation with electrons, protons, or ions; and
   an actuator unit configured to initiate one or more discharges of the dielectric structure by introducing a spark or defect at a surface of the dielectric structure,
   wherein the dielectric structure and the actuator unit are configured such that a predetermined waveform for one or more electromagnetic pulses (EMPs) is generated by the one or more discharges.

11. The system of claim 10, further comprising a controller that controls at least one of:
   the actuator unit to initiate the one or more discharges;
   at least one of timing, amplitude, and repetition of the one or more discharges; and
   at least one of timing, amplitude, and directionality of the generated EMPs.

12. The system of claim 11, wherein the controller is configured to control timing and/or location of the sparks or defects introduced by the actuator unit so as to generate the predetermined waveform.

13. The system of claim 10, further comprising:
   a modification unit configured to modify an output discharged from the dielectric structure,
   wherein the modification unit comprises at least one of a half-dipole antenna, a dipole antenna, a loop antenna, a helical antenna, a fractal antenna, a waveguide, a radio frequency horn, a curved reflector, lumped components, and distributed components.

14. The system of claim 10, wherein the actuator unit is configured to provide multiple sub-actuations spaced in time or location from each other to the dielectric structure.

15. The system of claim 14, wherein the dielectric structure includes multiple separate dielectric units, each dielectric unit having charge loaded therein, the multiple dielectric units together providing the loaded charge density spatial distribution.

16. The system of claim 10, wherein:
   the actuator unit is configured to provide a single actuation to the dielectric structure,
   the dielectric structure includes a single dielectric unit providing the loaded charge density spatial distribution, and
   the single actuation results in multiple pulses from the single dielectric unit spaced in time from each other, the multiple pulses forming the one or more EMPs.

17. The system of claim 10, further comprising a controller in communication with an electrical device subjected to the one or more generated EMPs from the dielectric structure and configured to interrogate the electrical device to assess EMP survivability of the electrical device.

18. A system comprising:
   a modeling unit configured to determine at least one of charge density spatial distribution, shape, actuation timing, and actuation location for a dielectric structure based on a desired waveform for one or more electromagnetic pulses (EMPs) emanating from the dielectric structure upon discharge.

19. The system of claim 18, wherein the modeling unit employs at least one of:
   a deterministic, potential-driven model that iteratively calculates electric field at points within the dielectric structure to determine propagation of discharge therein; and
   a probabilistic model that iteratively calculates electric field within the dielectric structure based on a stochastic function to determine propagation of discharge therein.

20. The system of claim 18, further comprising at least one of:
   a charge loading system configured to irradiate the dielectric structure with electrons, protons, or ions according to the charge density spatial distribution determined by the modeling unit;

an EMP initiation device configured to introduce a spark or defect to a surface of the dielectric structure according to the actuation timing or location determined by the modeling unit; and a fabrication device configured to form or machine the dielectric structure according to the shape determined by the modeling unit.

* * * * *